United States Patent [19]

Koyagi

[11] Patent Number: 4,971,443
[45] Date of Patent: Nov. 20, 1990

[54] OPTICAL POSITION DETECTING METHOD AND APPARATUS THEREFOR

[75] Inventor: Yasuyuki Koyagi, Tenjinkitamachi, Japan

[73] Assignee: Dainippon Screen Mfg. Co., Ltd., Japan

[21] Appl. No.: 289,542

[22] Filed: Dec. 23, 1988

[30] Foreign Application Priority Data

Dec. 25, 1987 [JP] Japan ................................. 62-331015
Jan. 19, 1988 [JP] Japan ..................................... 63-9944

[51] Int. Cl.$^5$ ........................................... G01B 11/14
[52] U.S. Cl. ........................................ 356/375; 356/1
[58] Field of Search ............. 356/375, 1; 250/201 AF, 250/201.1, 201.6

[56] References Cited

U.S. PATENT DOCUMENTS 3,759,615  9/1973  Loewe ................................. 356/375
4,575,237  3/1986  Suzuki .......................... 250/201 AF
4,589,773  5/1986  Ido et al. ................................. 356/1

Primary Examiner—Richard A. Rosenberger
Assistant Examiner—K. P. Hantis
Attorney, Agent, or Firm—Ostrolenk, Faber, Gerb & Soffen

[57] ABSTRACT

A method of and an apparatus for optically detecting the position of an object having a surface including first and second reflecting regions each having a different reflectance coefficient. First a ratio of reflectance of the first reflecting region to that of the second reflecting region is obtained. Incident optical beams are projected onto the measured surface of the object, and first and second reflected optical beams reflected by the first and second reflecting regions of the measured surface are received at a photoelectric conversion element to obtain first and second light receiving signals, respectively. Thereafter, the second light receiving signal is multiplied by the reflectance ratio to produce a correction light receiving signal. Further, the central position of the reflected optical beams is obtained on the basis of the first light receiving signal and the correction light receiving signal. Thus, the central position of the reflected optical beams can be obtained with very high accuracy.

14 Claims, 14 Drawing Sheets

OPTICAL POSITION DETECTING METHOD AND APPARATUS THEREFOR

BACKGROUND OF THE INVENTION

1. Field of the Invention

The present invention relates to an optical position detecting method and an apparatus for projecting incident optical beams on a measured surface of an object having two types of reflecting regions which are different in reflectance from each other, and of receiving reflected optical beams reflected by the reflecting regions on a photoelectric conversion element of at least a one dimensional arrangement, to thereby detect the projected position of the optical beams on the basis of a light signal received from the photoelectric conversion element.

2. Description of the Prior Art

In general, a contact exposure method, a proximity exposure method or the like is employed as a method of transferring a mask pattern of a photomask onto a substrate. In the proximity exposure method, the photomask and the substrate must be precisely arranged to be separated by a constant space of 20 to 50 μm, for example.

Thus, there have been proposed a number of devices for measuring the space between the photomask and the substrate. FIG. I illustrates a conventional position detecting apparatus for a proximity exposure system. As shown in FIG. 1, the conventional position detecting apparatus is adapted to project incident optical beams $B_1$ on the surface of an objective photomask 101 and to receive optical beams $B_2$ reflected by the photomask 101 onto a semiconductor position detector 107 of one-dimensional or two-dimensional arrangement. It is thus possible; to calculate the surface position of the photomask 101 on the basis of of received light signals $I_A$ and $I_B$ thereof. Assuming that symbol L denotes the distance between electrodes A and-8 and the symbol K denotes the distance between the electrode A and the position receiving the reflected optical beams $B_2$, the semiconductor position detector 107 outputs current values, in accordance with the following equations, from the respective electrodes A and B:

$$I_A = I_0 (L - X)/L \\ I_B = I_0 (X/L)$$ (1)

where the symbol $I_O$ denotes the light intensity of the reflected optical beams $B_2$.

Further, an arithmetic circuit 110 outputs the following ratio $P_X$ of the current value $I_A$ to the current value $I_B$ as a signal corresponding to the position X of the surface to be measured:

$$P_X = (L-X)-1 \quad \ldots (2)$$

The known position detecting apparatus is not satisfactory, however, because it is not sufficiently accurate. The reasons are as follows; position detecting apparatus cannot satisfy the requirement for higher accuracy. The reason for this is as follows:

The photomask comprises a fine mask pattern of a thin film provided on the surface of a glass plate, which mask pattern is formed by a film of chromium, for example, having a reflectance different from that of the glass plate.

Particularly, the reflecting surface of the photomask to be subjected to measurement is formed by the mask pattern portions and the exposed portions of the glass plate. As a result, two types of reflecting regions, which are different in reflectance from each other, are mixed in the reflecting surface of the photomask.

Therefore, an image formed by the reflected optical beams $B_2$ consists of regions G formed by an optical subbeam reflected by the glass plate portions and regions P formed by an optical subbeam reflected by the mask pattern portions, as shown in FIG. 2, and the conceptual light intensity distribution thereof is as shown in FIG. 3. Due to the variation in reflectivity of the two portions, the center-of-gravity position of the light intensity distribution varies with a change in the ratio of the glass plate portions to the mask pattern portions existing on the reflecting surface. This has the effect of changing the distance X. Assuming that a diameter D of the received optical beams $B_2$ is 50 μm and the ratio of reflectance of the glass plate portions to that of the mask pattern portions is 0.2 for example, an error of +10 μm may be produced in the detected position of the measured surface.

SUMMARY OF THE INVENTION

The present invention is directed to an optical position detecting method and apparatus for projecting first incident optical beams on a first measured surface of a first object having two types of reflecting regions different in reflectance from each other and receiving first reflected optical beams reflected by the reflecting regions by a first photoelectric conversion element of at least one-dimensional arrangement to detect the projected position of the first incident optical beams on the basis of a receiving signal outputted from the first photoelectric conversion element.

According to the present invention, the optical position detecting method comprises a first step of defining one of the two types of reflecting regions as a first reflecting region while defining the other one as a second reflecting region and obtaining the ratio of reflectance of the first reflecting region to that of the second reflecting region; a second step of projecting the first incident optical beams on the first measured surface, receiving a first reflected optical subbeam reflected by the first reflecting region to obtain a first light receiving signal responsive to the light intensity distribution of the first reflected optical subbeam and receiving a second reflected optical subbeam reflected by the second reflecting region to obtain a second light receiving signal responsive to the light intensity distribution of the second reflected optical subbeam, respectively a third step of multiplying the reflectance ratio and the second light receiving signal to find a corrected light receiving signal; and a fourth step of obtaining the central position of the first reflected optical beams as a function of the first light receiving signal and the corrected light receiving signal.

And the optical position detecting apparatus comprises first detecting means for projecting firs. incident optical beams on a first measured surface of a first object having two types of reflecting regions different in reflectance from each other and receiving first reflected optical beams reflected by the reflecting regions at a first photoelectric conversion element of at least one-dimensional arrangement to detect the projected position of the first incident optical beams on the basis of a signal received from the first photoelectric conversion element, wherein the first detecting means comprises first means for defining one of the two types of reflecting regions as a first reflecting region while defining the other one as a second reflecting region and obtaining the ratio of reflectance of the first reflecting region to that of the second reflecting region; second means for projecting the first incident optical beams on the first measured surface, receiving a first reflected optical subbeam reflected by the first reflecting region to obtain a first light receiving signal responsive to the light intensity distribution of the first reflected optical subbeam and receiving a second reflected optical subbeam reflected by the second reflecting region to obtain a second light receiving signal responsive to the light intensity distribution of the second reflected optical subbeam respectively; third means for multiplying the reflectance ratio and the second light receiving signal to find a corrected light receiving signal; and fourth means for obtaining the central position of the first reflected optical beams as a function of the first light receiving signal and the corrected light receiving signal.

The present invention is also directed to an optical position detecting method and apparatus for (a) projecting first incident optical beams on a first measured surface of a first object having two types of reflecting regions different in reflectance from each other, (b) receiving first reflected optical beams reflected by the reflecting regions by a first photoelectric conversion element of at least one-dimensional arrangement to detect the projected position of the first incident optical beams on the basis of a receiving signal outputted from the first photoelectric conversion element, (c) projecting second incident optical beams on a second measured surface, positioned to face the first measured surface, of a second object, (d) receiving second reflected optical beams reflected by the second measured surface by a second photoelectric conversion element of at least one-dimensional arrangement to detect the projected position of the second incident optical beams on the basis of a third light receiving signal outputted from the second photoelectric conversion element, and (e) calculating the space between the first object and the second object.

According to the present invention, the optical position detecting method comprises a first step of defining one of the two types of reflecting regions as a first reflecting region while defining the other one as a second reflecting region and obtaining the ratio of reflectance of the first reflecting region to that of the second reflecting region; a second step of projecting the first incident optical beams on a first measured surface, receiving a first reflected optical subbeam reflected by the first reflecting region to obtain a first light receiving signal responsive to light intensity distribution of the first reflected optical subbeam and receiving a second reflected optical subbeam reflected by the second reflecting region to obtain a second light receiving signal responsive to light intensity distribution of the second reflected optical subbeam,respectively; a third step of multiplying the reflectance ratio and the second light receiving signal to find a correction light receiving signal; a fourth step of obtaining the central position of the first reflected optical beams on the basis of the first light receiving signal and the correction light receiving signal; a fifth step of projecting second incident optical beams on a second measured surface and receiving second reflected optical beams to obtain a third light receiving signal; a sixth step of obtaining the central position of the second reflected optical beams on the basis of the third light receiving signal; and a seventh step of calculating the space between the first object and the second object on the basis of the central positions of the first and second reflected optical beams.

And the optical position detecting apparatus comprises the first detecting means, (a) second detecting means for projecting second incident optical beams on a second measured surface, positioned to face the first measured surface ,of a second object and receiving second reflected optical beams reflected by the second measured surface by a second photoelectric conversion element of at least one-dimensional arrangement to detect the projected position of the second incident optical beams on the basis of a third light receiving signal outputted from the second photoelectric conversion element, wherein the second detecting mean comprises (a-1) fifth means for projecting the second incident optical beams on the second measured surface and receiving the second reflected optical beams to obtain the third light receiving signal, and (a-2) sixth means for obtaining the central position of the second reflected optical beams on the basis of the third light receiving signal; and (b)an arithmetic circuit for calculating the space between the first object and the second object on the basis of the central positions obtained by the fourth means and the sixth means.

Accordingly, an object of the present invention is to provide an optical position detecting method and apparatus by which the central position of reflected optical beams can be obtained with higher accuracy.

Another object of the present invention is to provide an optical position detecting method and apparatus by which the space between a first object and a second object can be measured with higher accuracy.

These and other objects, features, aspects and advantages of the present invention will become more apparent from the following detailed description of the present invention when taken in conjunction with the accompanying drawings.

Figure 1:
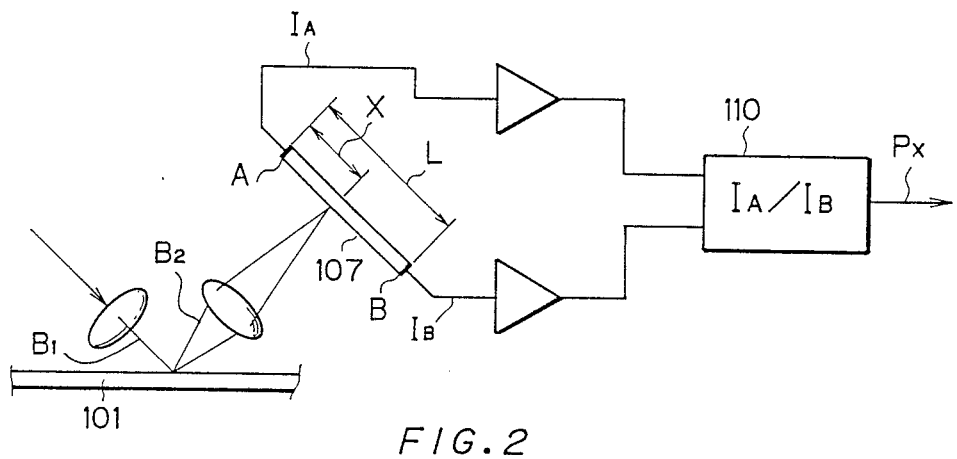
FIG. 1 illustrates a conventional position detecting apparatus.
Figure 2:
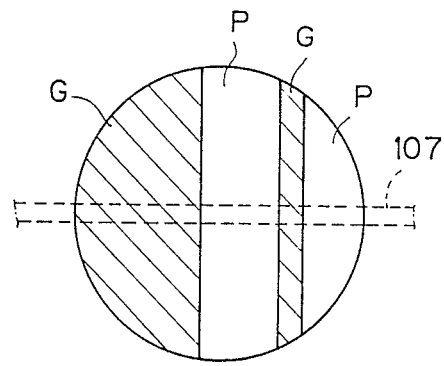
FIG. 2 illustrates an image formed by reflected optical beams.
Figure 3:
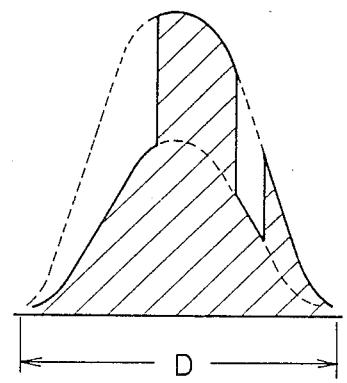
FIG. 3 illustrates a conceptual light intensity distribution thereof
Figure 4:
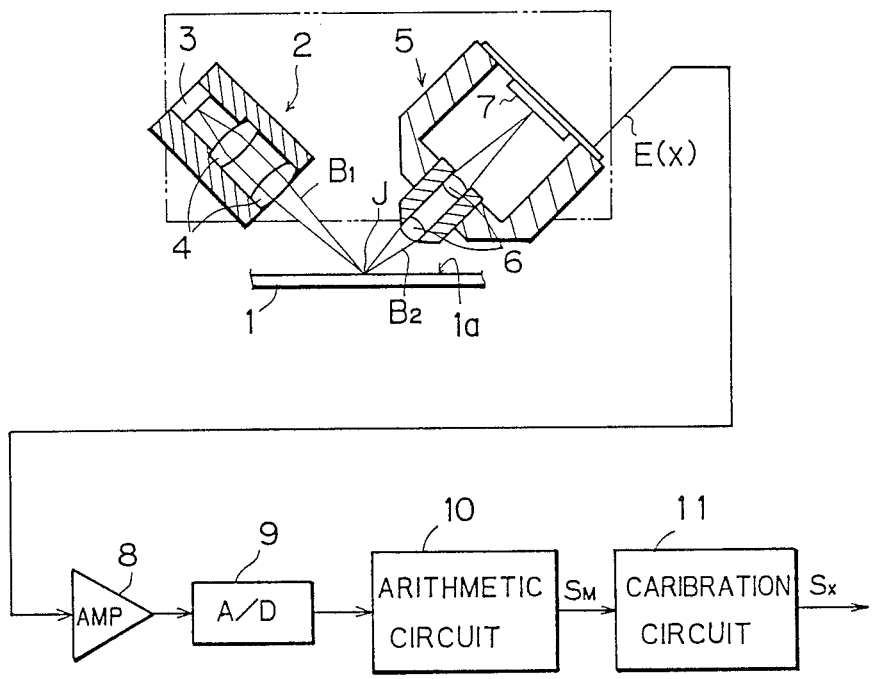
FIG.4 is a schematic block diagram showing an optical position detecting apparatus to which first and second embodiments of an optical position detecting method according to the present invention can be applied.
Figure 12:
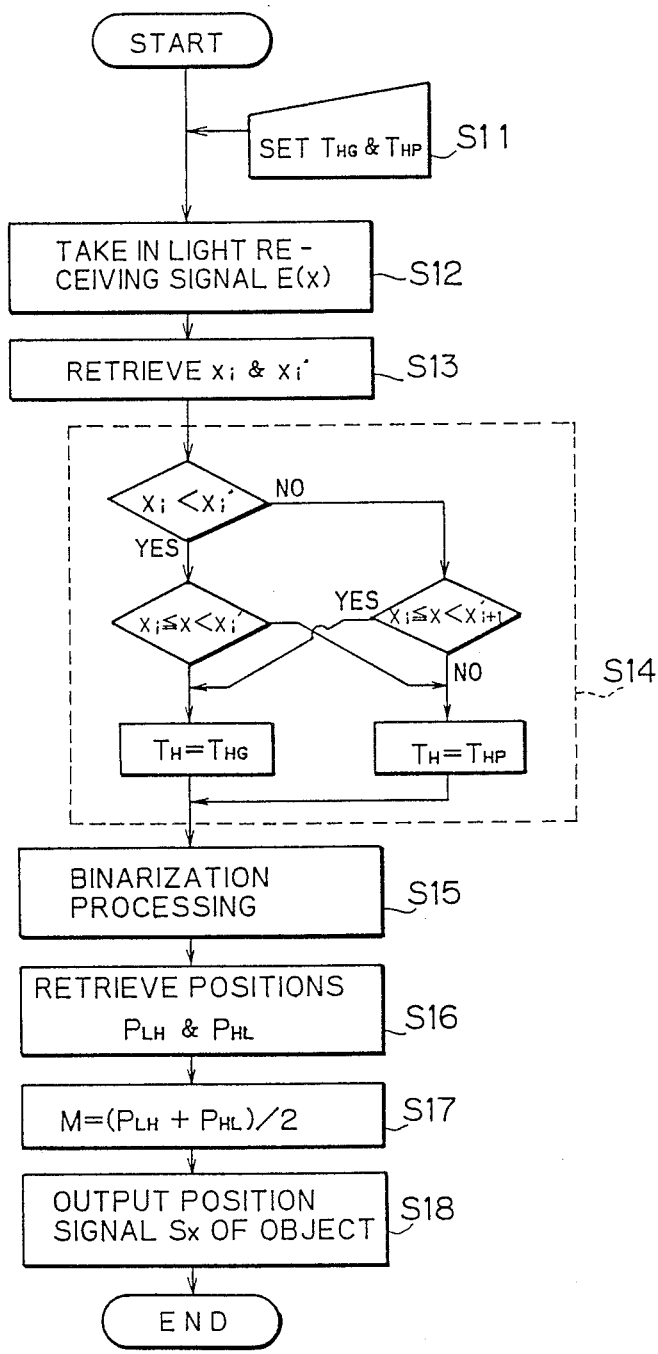
Figure 13A:
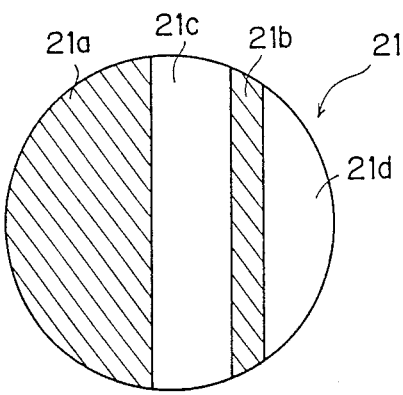
Figure 13B:
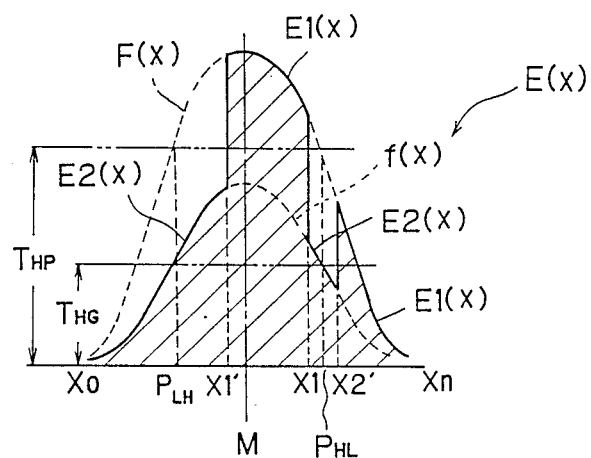
Figure 13C:
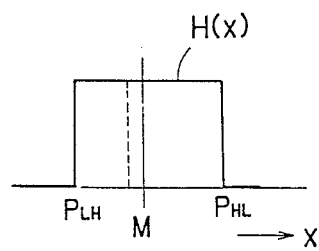
Figure 14:
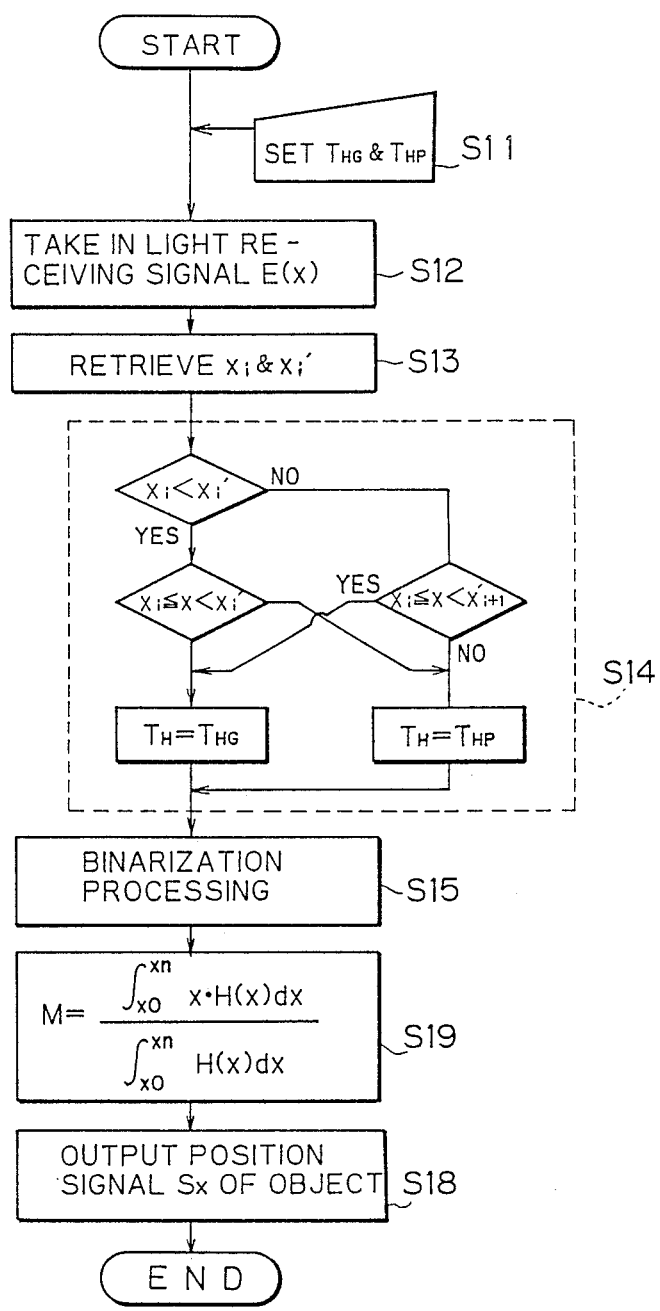
Figure 15:
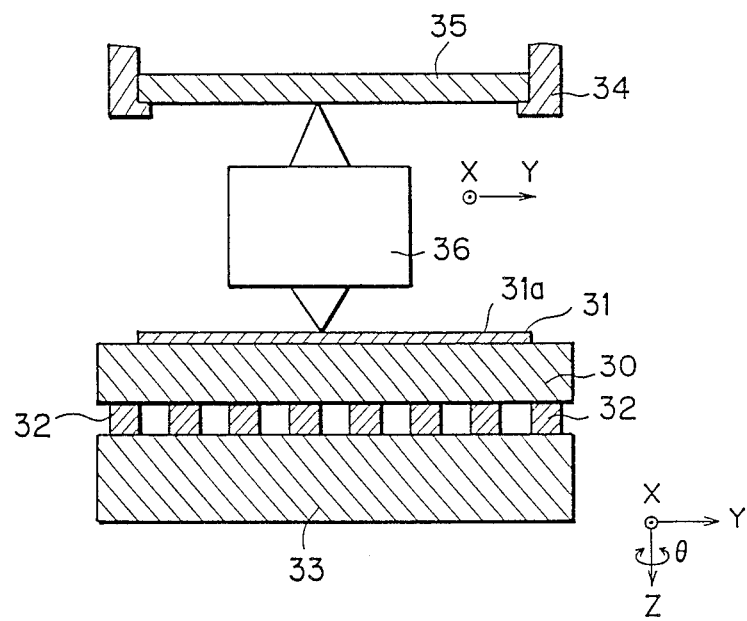
Figure 18A:
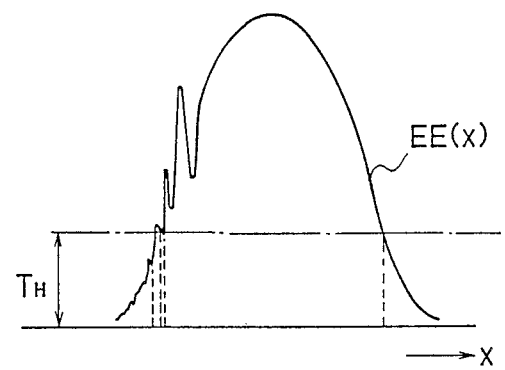
Figure 18B:
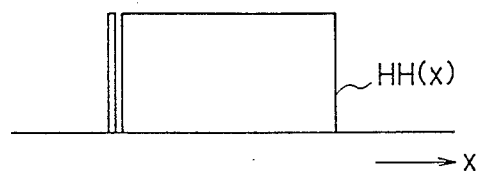
Figure 16:
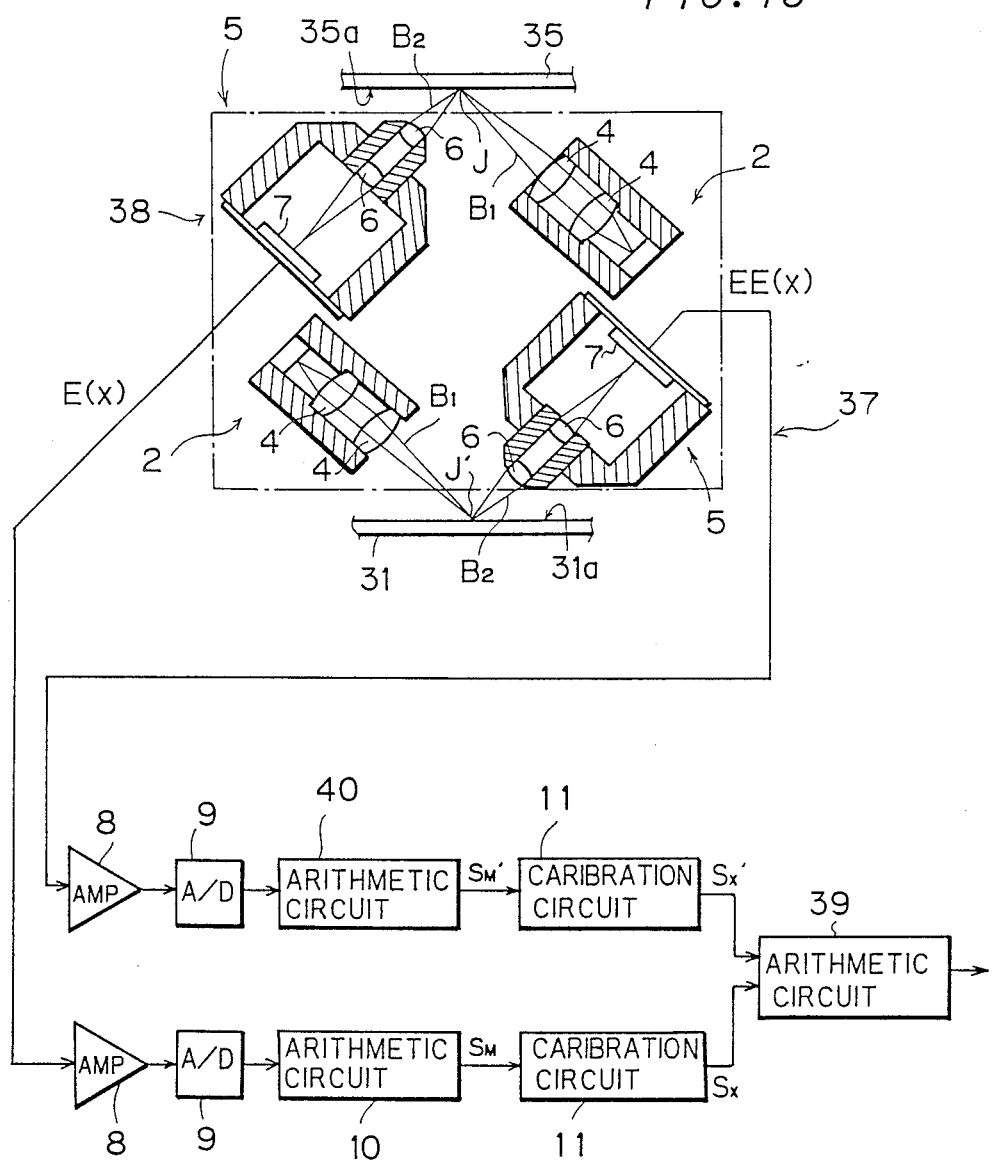
Figure 17:
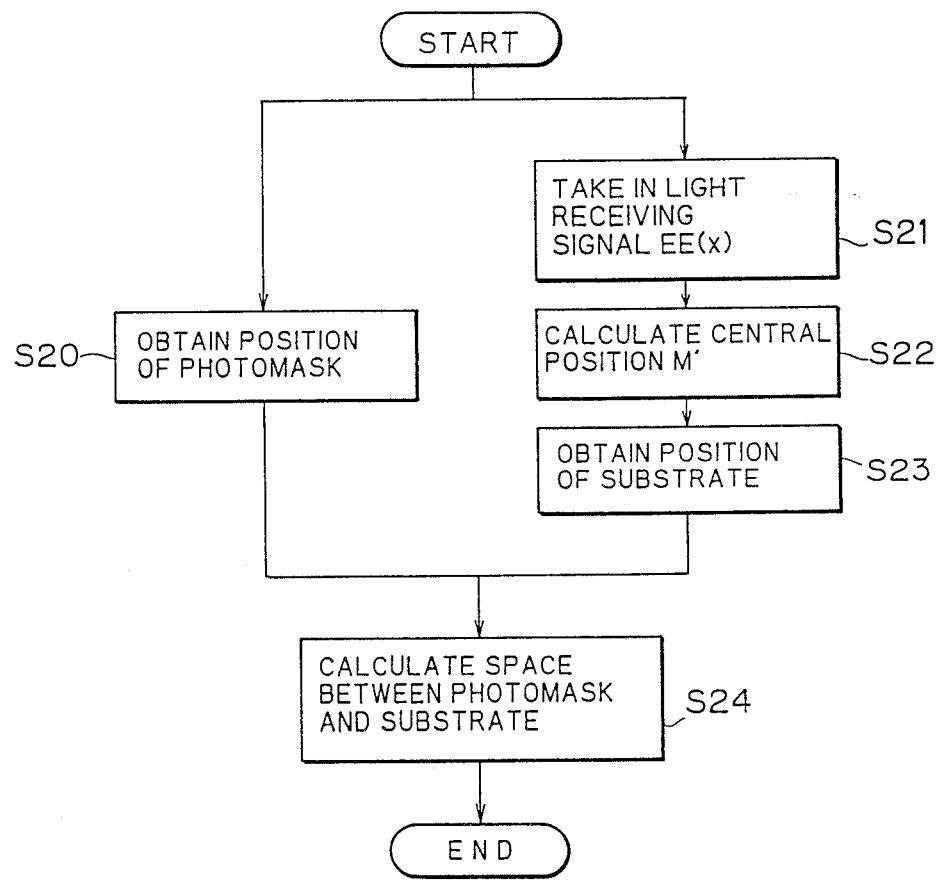

FIG.a 11 is a schematic block diagram showing an optical position detecting apparatus to which third and fourth embodiments of the optical position detecting method according to the present invention can be applied:

FIG. 12 illustrates the third embodiment of the optical position detecting method according to the present invention;

FIG.13A illustrates an image formed by optical beams reflected by another measured surface;

FIG.13B illustrates a conceptual light intensity distribution thereof;

FIG.13C illustrates a binarized signal thereof;

FIG.14 illustrates a fourth embodiment of the optical position detecting method according to the present invention;

FIG.15 is a sectional view showing a proximity exposure system ,into which the first embodiment shown in FIG.4 is integrated;

FIG. 16 is a schematic block diagram showing the optical position detecting apparatus shown in FIG.15;

FIG. 17 illustrate a the optical position detecting method according to the optical position detecting apparatus shown in FIG. 16;

FIG.18A illustrates a conceptual light intensity distribution of optical beams reflected by a substrate having a color filter on its surface; and FIG.18B illustrates a binary signal derived from FIG. 18A.

DESCRIPTION OF THE PREFERRED EMBODIMENTS

A. First and Second Embodiments

FIG. 4 is a schematic block diagram showing an optical position detecting apparatus to which first and second embodiments of the optical position detecting method according to the present invention can be applied. As shown in FIG. 4, the optical position detecting apparatus comprises a projector 2 for projecting optical beams $B_1$ on a measured surface 1a of a photomask 1, which is an object of position measurement. A light receiver 5 for receives optical beams $B_2$ reflected by the measured surface 1a. An amplifier 8 is provided for amplifying a light receiving signal $E(x)$ outputted from the light receiver 5, and is coupled in turn to an A-D converter 9. An arithmetic circuit 10 for determining a central position M of the reflected optical beams $B_2$ as a function of an output signal from the A-D converter 9 to output a position signal $S_M$ showing the central position M. A calibration circuit 11 is coupled to the output of the arithmetic circuit; for calibrating the position signal $S_M$ on the basis of an initialized value and the like to obtain a position X on the photomask and outputs a position signal $S_X$ indicating the position X.

The projector 2 comprises a laser diode and projection lenses 4 for contracting the optical beams $B_1$ emitted from the laser diode 3 to a prescribed beam diameter, thereby to project the optical beams $B_1$ onto the measured surface 1a of the photomask 1 at a prescribed angle via the projection lenses 4.

The light receiver 5 includes light receiving lenses 6 for imaging the optical beams $B_2$ reflected by a spot-irradiated region J on the measured surface 1a of the photomask 1 in a prescribed position, and a photoelectric converter 7. The photoelectric converter 7 is formed by charge-coupled devices which are one-dimensionally arranged in the imaging position of the light receiving lenses 6. The converter 7 to receives the optical beams $B_2$ reflected by the spot-irradiated region J and outputs the light receiving signal $E(x)$.

Figure 5A:
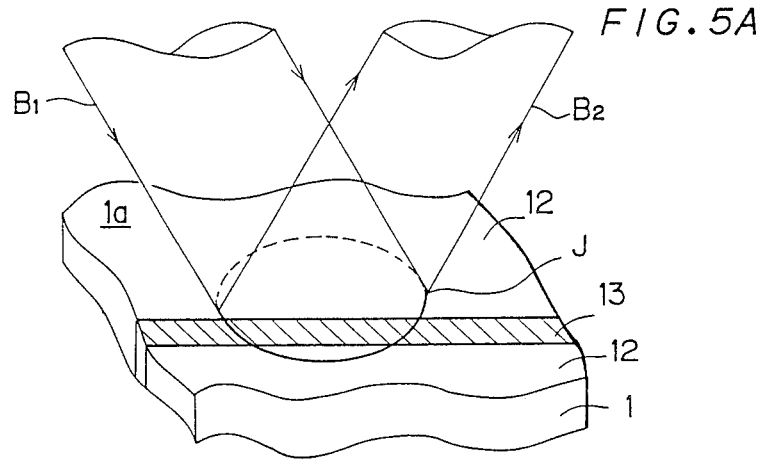
FIG.5A is a perspective view showing a measured surface of a photomask.
Figure 5B:
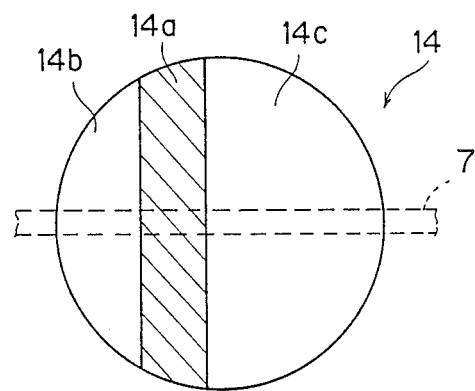
FIG. 5B illustrates an image formed by optical beams reflected by the measured surface shown in FIG. 5A.

Turning to FIG. 5A, when surfaces of a mask pattern 12 and a glass plate 13, serving as a substrate of the photomask 1, appear on the measured surface 1a of the photomask 1 and the optical beams $B_1$ are applied to the spot-irradiated region J of the measured surface 1a as shown, an image 14 as shown in FIG. 5B is formed on the converter 7 arranged at the imaging position of the light receiving lenses 6. The light receiving signal $E(x)$ outputted from the photoelectric converter 7 has a conceptual light receiving intensity distribution as shown in FIG. 5C.

In the case of the spot-irradiated region J formed by the surfaces of the mask pattern 12 and the glass plate 13, the reflected optical beams are formed by two types of reflected optical subbeams, which are respectively reflected by the surfaces of the mask pattern 12 and the glass plate 13 of the spot-irradiated region J.

Referring to FIG. 5B, a region 14a of the image 14 is formed by the optical subbeam reflected by the surface of the glass plate 13, and the remaining regions 14b and 14c are formed by the optical beams reflected by the surface of the mask pattern 12.

Figure 5C:
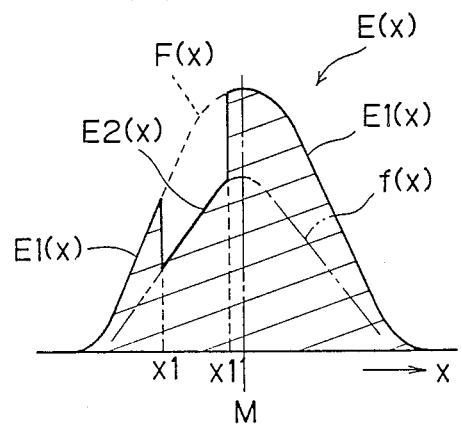
FIG.5C illustrates a conceptual light intensity distribution thereof.

Referring to FIG. 5C, a portion of the light receiving signal $E(x)$ in an interval x1 - x1' is outputted from a portion of the photoelectric converter 7 corresponding to the region 14a (FIG. 5B), and portions of the light receiving signal $E(x)$ in other intervals are outputted from those portions of the photoelectric converter corresponding to the regions 14b and 14c (FIG. 5B). In the following description, the portion of the light receiving signal $E(x)$ corresponding to the optical subbeam reflected by the surface of the mask pattern 12 is defined as a first light receiving signal $E1(x)$, while that of the light receiving signal $E(x)$ corresponding to the optical subbeam reflected by the surface of the glass plate 13 is defined as a second light receiving signal $E2(x)$. The contents of such definition are mathematically expressed as follows:

$$E(x) = \begin{cases} E1(x) (x < x1, x1' < x) \\ E2(x)(x1 < x < x1') \end{cases} \quad (3)$$

The feature apparent from FIG. 5C is that the level of the second light receiving signal $E2(x)$ is much lower than that of the first light receiving signal $E1(x)$. This is because reflectance of the glass plate 13 is lower than that of the mask pattern 12, and hence the intensity of the optical subbeam reflected by the glass plate 13 is lower than that of the optical subbeam reflected by the mask pattern 12.

Figure 6A:
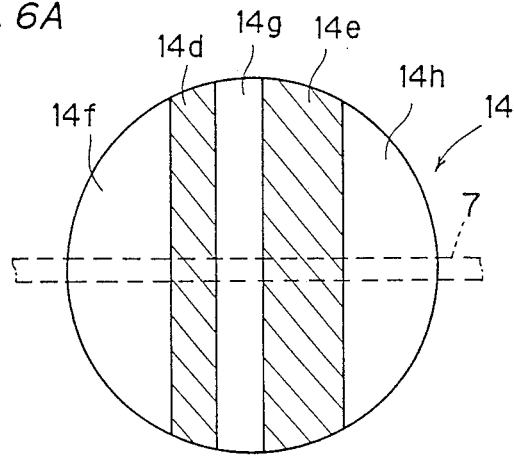
FIG. 6A illustrates an image formed by optical beams reflected by another measured surface.
Figure 6B:
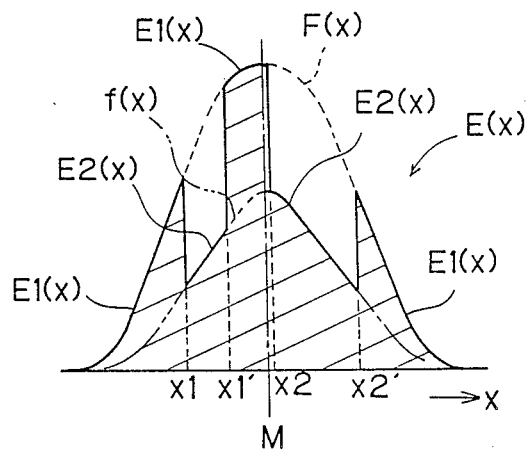
FIG. 6B illustrates a conceptual light intensity distribution thereof.

When another image 14 as shown in FIG. 6A is formed, a light receiving signal $E(x)$ outputted from the photoelectric converter 7 exhibits a conceptual light receiving intensity distribution as shown in FIG. 6B, for a reasons similar to the above. As shown in FIGS.6A and 6B, regions 14d and 14e are formed by optical subbeams reflected by the surfaces of a glass plate, the remaining regions 14f, 14g and 14h being formed by optical subbeams reflected by the surfaces of a mask pattern. The level of a second light receiving signal E2(x) outputted from the photoelectric converter 7 in correspondence with regions 14d and 14e (FIG. 6A) is sharply lowered as compared with that of a first light receiving signal Ei(x) outputted from the photoelectric converter 7 in correspondence with regions 14f, 14g and 14h (FIG. 6A).

The arithmetic circuit 10 and the calibration circuit ii are formed by microcomputers. for example. The arithmetic circuit 10 is adapted to determine the central position M of reflected optical beams $B_2$ and to output the position signal $S_M$ thereof, while the calibration circuit 11 is adapted to calibrate the position signal $S_M$ ( the central position M on the basis of an initialized value and the like to obtain the position of the measured surface 1a of the photomask 1 and to output the position signal $S_X$ thereof.

A-1. First Embodiment

Figure 7:
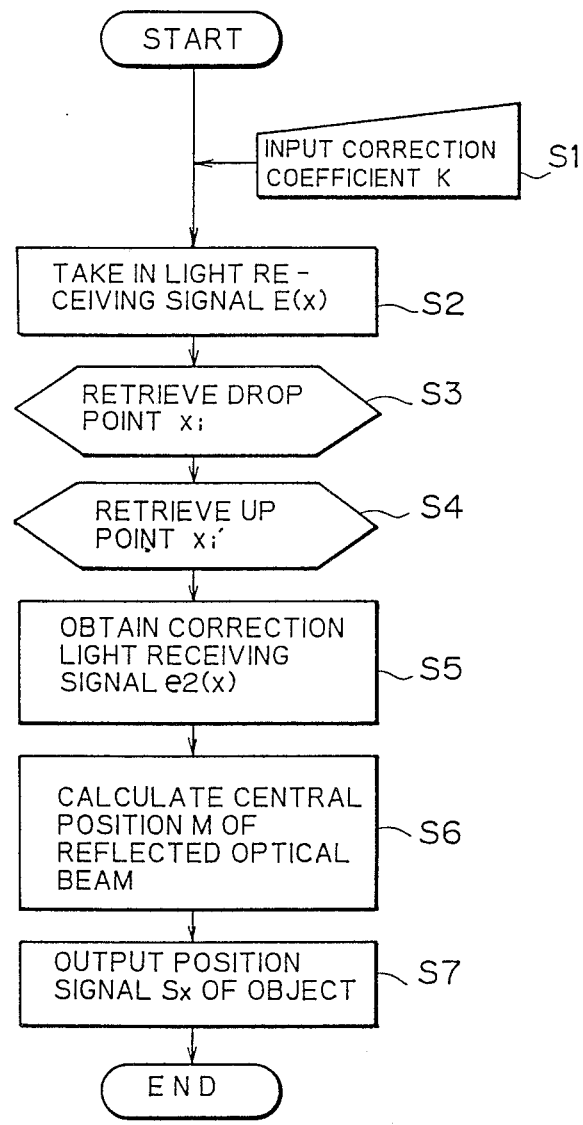
FIG. 7 illustrates a first embodiment of an optical position detecting method according to the present invention.

FIG. 7 illustrates the first embodiment of the optical position detecting method according to the present invention. First, a correction coefficient K is set into the apparatus at a step S1. The correction coefficient K is the ratio of reflectance of the glass plate 13 (FIG. 5A) to that of the mask pattern 12 (FIG. 5A). In more concrete terms, the aforementioned optical position detecting apparatus is employed to obtain a light receiving signal f(x) of that part of the entire surface of the spot-irradiated region J which is defined by the surface of the glass plate 13 and a light receiving signal F(x) which is defined by the surface of the mask pattern 12. Then, the light receiving signals F(x) and f(x) are substituted in the following equation, to thereby obtain the correction coefficient K:

$$K = f(x)/F(x) \quad \ldots (4)$$

Both of the light receiving signals f(x) and F(x) are in normal distribution. The correction coefficient K is substantially constant since the mask pattern 12 is generally formed by a metal thin film of chromium or the like.

Figure 8A:
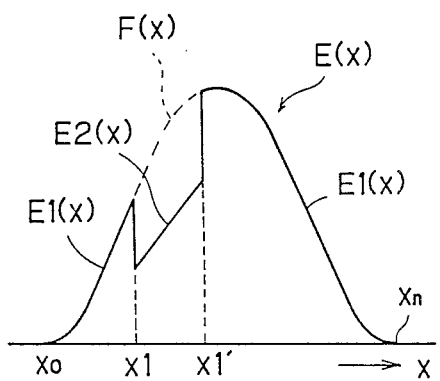
FIG. 8A illustrates a light intensity distribution of a light receiving signal.

At a step S2, the laser diode 3 projects the optical beams $B_1$ on the spot-irradiated region J of the photomask at a prescribed angle, and the photoelectric converter 7 receives the optical beams $B_2$ reflected by the spot-irradiated region J. The light receiving signal E(x) outputted from the photoelectric converter 7 then is stored in a buffer memory (not shown) of the arithmetic circuit 10. In the following description, it is assumed that the light receiving signal E(x), having the conceptual light receiving intensity distribution shown in FIG. 5C, is stored in the buffer memory of the arithmetic circuit 10. FIG. 8A illustrates the light receiving intensity distribution of the light receiving signal E(x) stored in the buffer memory of the arithmetic circuit 10. Symbols xO and xn represent lower and upper limits of the effective detection range of the photoelectric converter 7. respectively.

At a step S3, a position x1 (hereinafter referred to as "drop point") is obtained in which the light receiving signal E(x) drops sharply. The drop point will be stored in an internal memory (not shown). The drop point x1 is obtained by a method which determines whether the rate of change (dE(x)/dx) of the light receiving signal E(x) is positive or negative and whether or not the absolute value thereof is greater than a prescribed value, for example.

Similar to the above, a position x1' (hereinafter referred to as "up point") in which the light receiving signal E(x) rises sharply is obtained at a step S4, to be stored in the internal memory. Thus, the first light receiving signal E1(x) and the second light receiving signal E2(x) can be obtained on the basis of the light receiving signal E(x), the down point x1 and the up point x1'.

At a step S5, the second light receiving signal E2(x) is corrected on the basis of the correction coefficient K, to thereby obtain a correction light receiving signal e2(x). The content of this correction is expressed as follows:

$$e2(x) = E2(x)/K \quad \ldots (5)$$

Figure 8B:
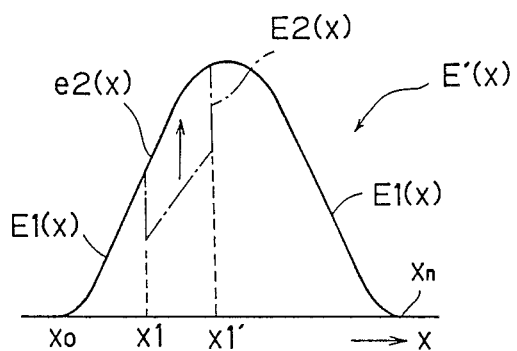

As shown in FIGS. 8A and 8B, the correction light receiving signal e2(x) is identical or substantially similar to that of the signal F(x) (FIGS. 6C and 8A) measured at the step S1 in a level.

At a step S6, the central position M of the reflected optical beams $B_2$ is obtained on the basis of the first light receiving signal E1(x) and the correction light receiving signal e2(x). Namely, the weighted mean of a corrected signal E'(x) (FIG. 8B) formed by the first light receiving signal E1(x) and the correction light receiving signal e2(x) is obtained by means of the following equation, wherein the value obtained is the central position M:

$$M = \frac{\int_{x0}^{xn} x\, E'(x) dx}{\int_{x0}^{xn} E'(x) dx} \quad (6)$$

After obtaining the central position M, the position signal $S_M$ showing the central position M is outputted from the arithmetic circuit 10.

At a step S7, the position signal $S_M$ is calibrated on the basis of an initialized value and the like. to obtain the position of the measured surface 1a of the photomask 1. The said position is supplied as an output position signal $S_X$.

While the central position is obtained on the basis of the light receiving signal E(x) without consideration of the error caused by the much lower level of the second light receiving signal Eg(x) as compared with that of the first light receiving signal E1(x) in the prior art, the weighted mean of the corrected signal E'(x) is obtained as the central position in this embodiment. Thus, the error can be eliminated. Consequently, the central position M of the optical beams $B_2$ is obtained with higher accuracy.

A-2. Second embodiment

Figure 9:
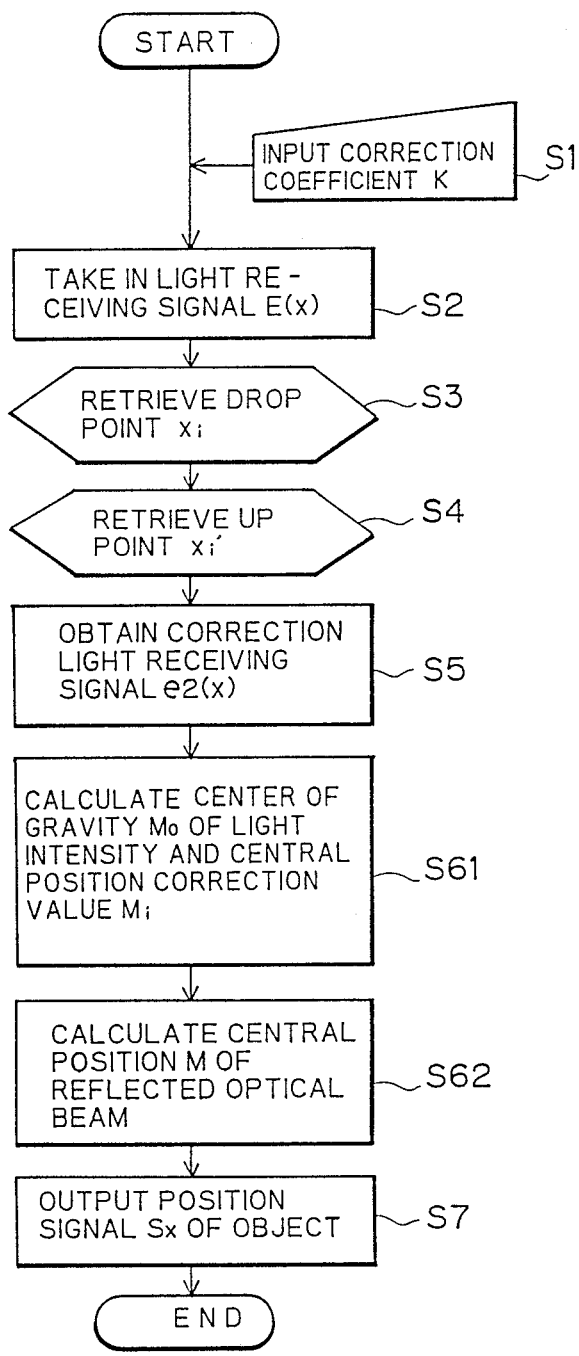
FIG. 9 illustrates a second embodiment of the optical position detecting method according to the present invention.

FIG. 9 illustrates the second embodiment of the optical position detecting method according to the present invention.

At steps S1 to S4, a correction coefficient K is set/inputted (step S1) and a light receiving signal E(x) is stored in the buffer memory (not shown) of the arithmetic circuit 10 (step S2), and thereafter a drop point and an up point are respectively obtained (steps S3 and S4), in a similar manner to the first embodiment.

At the step S5, the second light receiving signal E2(x) is corrected on the basis of the correction coefficient K , similarly to the first embodiment, to thereby obtain a correction light receiving signal e2(x).

Figure 10:
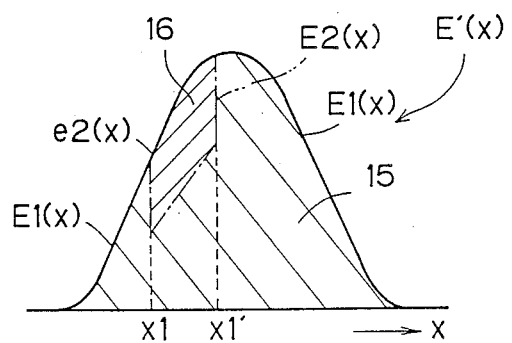
FIGS. 8B and 10 illustrate a light intensity distribution of a corrected signal.

At a step S61, a center-of-gravity position $M_O$ of a region such as the region 15 shown in FIG. 10 and a center-of-gravity position $M_i$ of a region such as the region 16 shown in FIG. 10 are obtained. The center-of-gravity position $M_O$ is calculated from the following equation:

$$M_0 = \left( \int_{x0}^{xn} x \cdot E(x) dx \right) / G_0 \quad (7)$$

where $G_0 = \int_{x0}^{xn} E(x) dx.$

The center-of-gravity position $M_i$ (i=1,2,...) is calculated from the following equation:

$$M_i = \left( \int_{xi}^{xi'} x \cdot E(x) dx \right) / G_i \quad (8)$$

where $G_i = \int_{xi}^{xi'} [e2(x) - E(x)] dx$

For the convenience of calculation, the equation (8) is transformed as follows:

$$\left. \begin{array}{l} M_i = \left( \int_{xi}^{xi'} x[e2(x) - E(x)] dx \right) / P_i \\ P_i = \int_{xi}^{xi'} E(x) dx \\ G_i = P_i (1 - K)/K \end{array} \right\} \quad (9)$$

At a step B62, the center-of-gravity positions $M_O$ and $M_i$ and areas $G_O$ and $G_i$ obtained in the aforementioned manner are substituted in the following equation, to thereby calculate the central position M:

$$M = \frac{M_0 \cdot G_0 + \Sigma M_i \cdot G_i}{G_0 + \Sigma G_i} \quad (10)$$

After obtaining the central position M, the position $S_M$ showing the central position M is outputted from the arithmetic circuit 10.

At a step S7, the position signal $S_M$ is calibrated on the basis of an initialized value and the like, similarly to the first embodiment, to thereby obtain the position of the measured surface 1a of the photomask 1.

The second embodiment obtains not only the weighted mean of the light receiving signal E(x), but also that of such region(s) as the region 16 shown in FIG. 10 and then the central position M of the reflected optical beams $B_2$ is obtained on the basis of these values, whereby an effect similar to that of the first embodiment is attained.

B. Third and Fourth Embodiments

Figure 11:
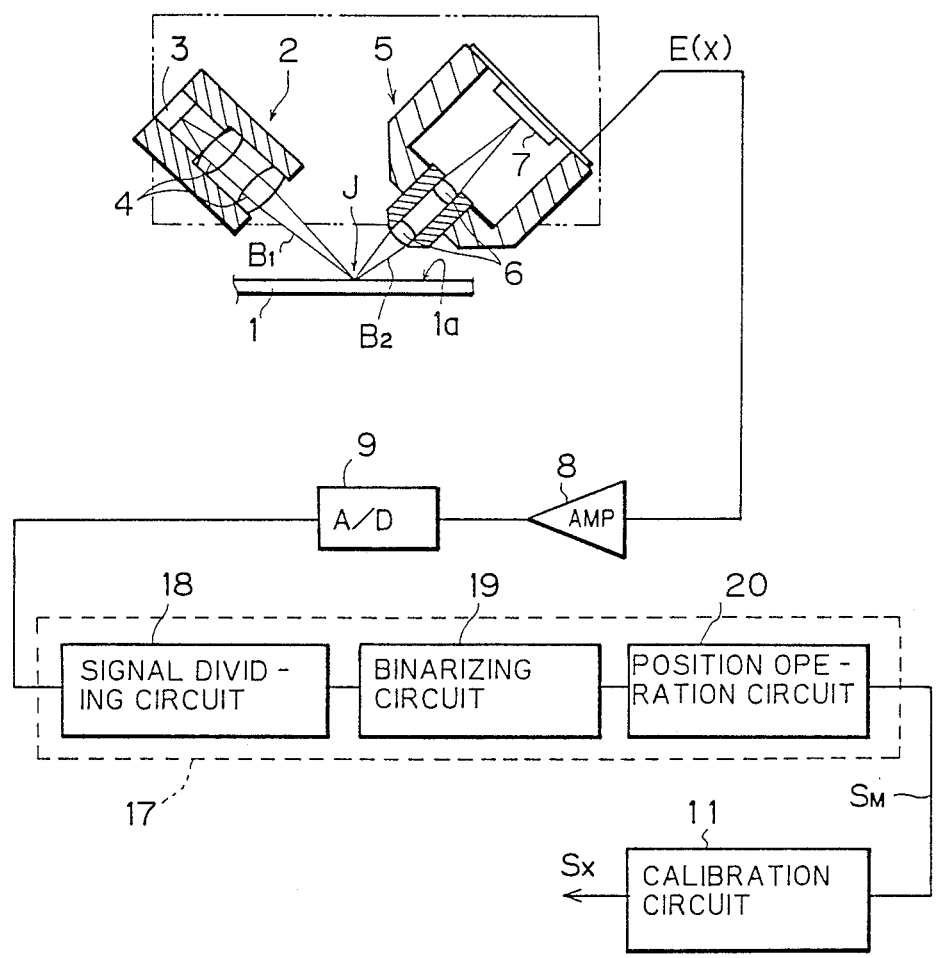

FIG. 11 is a schematic block diagram showing an optical position detecting apparatus for use with third and fourth embodiments of the optical position detecting method according to the present invention. As shown in FIG. 11, the optical position detecting apparatus is formed by a projector 2, a light receiver 5, an amplifier 8, an A-D converter 9, an arithmetic circuit and a calibration circuit 11. Except for the arithmetic circuit 17, the said components are identical in structure to that of the apparatus of FIG. 4 and hence redundant description is omitted.

The arithmetic circuit 17, which comprises a signal dividing circuit 18, a digitizing circuit 19 and a position determining circuit 20 for operating the central position of reflected optical beams $B_2$ as a function of an output signal from the digitizing circuit 19, may consist of a microcomputer, for example. The signal dividing circuit 18 is adapted to perform processing operations similar to that at the steps S3 and S4 in the first or second embodiment. The circuit 19 is adapted to digitize a light receiving signal E(x). The position operating circuit 20 calculates the central position M of the reflected optical beams $B_2$.

B-1. Embodiment

FIG. 12 illustrates the third embodiment of the optical position detecting method according to the present invention. First, two threshold values $T_{HG}$ and $T_{HP}$ are set/inputted by a device (not shown) at a step S11. The threshold values $T_{HG}$ and $T_{HP}$ are appropriately set to coincide with the ratio of reflectance of a glass plate to that of a mask pattern. Namely, light receiving signals F(x) and f(x) are respectively obtained similarly to the first or second embodiment and substituted in the following equation to obtain the ratio of the light receiving signal f(x) to the light receiving signal F(x). This ratio can then be used to determine; the threshold values $T_{HG}$ and $T_{HP}$ $$f(x)/F(x) = T_{HG}/T_{HP} \quad \ldots (11)$$

At a step S12, optical beams $B_1$ are projected on a spot-irradiated region J of a photomask 1 at a prescribed angle from a laser diode 3, similarly to the first or second embodiment, and optical beams $B_2$ reflected by the spot-irradiated region J are received by a photoelectric converter 7. A then a light receiving signal E(x) from the photoelectric converter is stored in a buffer memory (not shown) of the signal dividing circuit 18. In the following description, it is assumed that an image 21 is formed on an imaging position of light receiving lenses 6 as shown in FIG. 13A, and the light receiving signal E(x) having a conceptual light receiving intensity distribution as shown in FIG. 13B is stored in the buffer memory of the signal dividing circuit 18.

Referring to FIG. 13A, regions 21a and 21b of the image 21 are formed by optical subbeams reflected by the surface of the glass plate, and the regions 21c and 21d are formed by optical subbeams reflected by the surface of the mask pattern, similarly to the first or second embodiments. A portion of the light receiving signal E(x) in an interval x0 - x1, is outputted from a portion of the photoelectric converter 7 corresponding to the region 21a, and portions of the light receiving signal E(x) in intervals x1' - x1, x1 x2' and x2' - xn are outputted from those portions of the photoelectric converter 7 corresponding to the regions 21c, 21b and 21d. respectively. For the following description, the portions of the light receiving signal E(x) in intervals x1' - X1 and x2' - xn are defined as a first light receiving signal E1(x), while those portions of the light receiving signal E(x) in intervals x0 - x1' and x1 - x2' are defined as a second light receiving signal E2(x).

At a step S13, a drop point x1 and up points x1' and x2' are respectively obtained ,similarly to the first or second embodiment, to be stored in an internal memory (not shown).

At a step S14, the first light receiving signal E1(x) is made to correspond to the threshold value $T_{HP}$ while the second light receiving signal E2(x) is made to correspond to the threshold value $T_{HG}$. The step S14 is repeated for a time corresponding to the up point xi′ and the drop point xi.

At a step S15, the first light receiving signal E1(x) is digitized on the basis of the threshold value $T_{HP}$, and the second light receiving signal E2(x) is binary on the basis of the threshold value $T_{HG}$. Thus, a binary signal H(x) shown in FIG. 13C is obtained.

At a step S16, a position $P_{LH}$ at which the binary signal H(x) rises from a low level to a high level is obtained, while a position $P_{HL}$ at which the signal falls from a high level to a low level is obtained. The positions $P_{LH}$ and $P_{HL}$ may be obtained by a method similar to that of obtaining the up point xi′ and the drop point xi, for example.

At a step S17, the positions $P_{LH}$ and $P_{HL}$ obtained at the step BIG are substituted in the following equation, to obtain the central position M of the reflected beams $B_2$.

$$M = (P_{LH} + P_{HL})/2 \qquad \ldots (12)$$

A position signal $S_M$ showing the central position M is outputted from the position operating circuit 20.

At a step S18, the position signal $S_M$ is calibrated on the basis of an initialized value and the like to obtain the position of a measured surface 1a of a photomask 1. Thereafter, the signal $S_x$ showing the position is outputted from the calibration circuit 11.

As hereinabove described, the first light receiving signal E1(x) is digitized on the basis of the threshold value $T_{HP}$ and the second light receiving signal E2(x) is digitized on the basis of the threshold value $T_{HG}$ to obtain the binary signal H(x). Thereafter, the central position M of the reflected beams $B_2$ is obtained on the basis of the binary signal H(x). Therefore, an effect similar to that of the first embodiment is attained.

B-2. Fourth Embodiment

FIG. 14 illustrates the fourth embodiment of the optical position detecting method according to the present invention.

At steps S11 to S15, two threshold values $T_{HG}$ and $T_{HP}$ are set/inputted (step B11) and a light receiving signal E(x) is stored in the buffer memory (not shown) of the signal dividing circuit 18 (step S12), and thereafter a drop point and an up point are respectively obtained (step S13), similarly to the third embodiment. Then, a first light receiving signal E1(x) is made to correspond to the threshold value $T_{HP}$, while a second light receiving signal E2(x) is made to correspond to the threshold value $T_{HG}$ (step S14), and the first light receiving signal E1(x) is digitized on the basis of the threshold value $T_{HP}$ and the second light receiving signal E2(x) is digitized on the basis of the threshold value $T_{HG}$. Thus, a binary signal H(x) is obtained (step S15). For the following description it is assumed that the binary signal H(x) shown in FIG. 13C is obtained similarly to the third embodiment.

At a step S19, the weighted mean of the binary signal H(x) is calculated from the following equation to provide the central position M:

$$M = \frac{\int_{x0}^{xn} x \cdot H(x)\,dx}{\int_{x0}^{xn} H(x)\,dx} \qquad (13)$$

A position signal $S_M$ showing the central position M is outputted from the position operating circuit 20.

At a step S18, the position signal $S_M$ is calibrated on the basis of an initialized value and the like, and a signal $S_x$ showing the position of the measured surface 1a of a photomask i is outputted from the calibration circuit 11.

As hereinabove described, the central position M of the reflected beams $B_2$ is obtained on the basis of the binary signal H(x), similarly to the third embodiment. Therefore, an effect similar to that of the first embodiment is attained.

In general, discontinuous parts appear in the light receiving signal E(x) due to the influence of noise or the like. Thus, the binary signal H(x) is also made discontinuous, and hence it is difficult to unequivocally determine the positions $P_{LH}$ and $P_{HL}$, which makes it difficult to detect the central position M in the third embodiment. According to the fourth embodiment, however, the central position M can be detected with sufficient accuracy since the same is obtained by the weighted mean of the binary signal H(x) as shown in the equation (13).

While each of the aforementioned embodiments has been described with reference to the case where the mask pattern and the glass substrate appear on the measured surface 1a, the present invention is not restricted to this example but can also be applied to the case where two types of reflected regions, which are different in reflectance from each other, are provided on a measured surface. Further, the present invention is also applioable to the case where three or more types of reflecting regions, which are different in reflectance from each other, are provided on a measured surface.

C. Embodiment for proximity Exposure System

FIG. 15 is a a sectional view showing a proximity exposure system, into which the first embodiment shown in FIG. 4 is integrated. As shown in FIG. 15, the proximity exposure system comprises a chuck 30 for loading a substrate 31 on its surface flattening means 32 for flattening of the substrate 31, a stage 33 for positioning the substrate 31, a photomask holder 34 for holding a photomask 35 and an optical position detecting apparatus 36 for measuring the space between the substrate 31 and the photomask 3S.

The flattening means 32 is formed by a piezoelectric ceramic, for example, which may be replaced by a driving mean formed by a ball thread and a motor to raise and lower the chuck 30. The state 33 is adapted to three-dimensionally move and turn the chuck 30.

FIG. 16 is a schematic block diagram showing the optical position detecting apparatus 36. As shown in FIG. 16, the optical position detecting apparatus 86 comprises substrate position detecting means 37 for detecting the position of the substrate 31, photomask position detecting means 38 for detecting the position of the photomask 35 and an arithmetic circuit 39 for calculating the space between the substrate 31 and the photomask 35.

As shown in FIG. 16, the substrate position detecting means 37 is formed by a projector 2, a light receiver 5, an amplifier 8, an A-D converter an arithmetic circuit 40 and a calibration circuit 11. Except for the arithmetic circuit 40, the said components are identical in structure to those of the first embodiment, and hence redundant description is omitted. The arithmetic circuit 40 is adapted to determine the central position M of reflected optical beams $B_2'$ on the basis of a light receiving signal EE(x) and to output a position signal $S_M'$ indicative thereof.

The photomask position detecting means 38 is identical in structure to the optical position detecting apparatus shown in FIG. 4, and hence redundant description is omitted.

The arithmetic circuit 39 may consist of a microcomputer, for example, adapted to determine the space between the substrate 31 and the photomask 35 on the basis of position signals $S_x'$ and $S_x$ outputted from the substrate position detecting means 37 and the photomask position detecting means 38.

FIG. illustrates an optical position detecting method for use with the optical position detecting apparatus 36 shown in FIG. 16. At a step S20, the position of the photomask 35 is obtained, similarly to the the first embodiment of the optical position detecting method shown in FIG. 7. Then, a signal $S_x$ showing the position of the photomask 35 is outputted.

At the same time, the steps S21 S22,223 and are performed:

At a step S21, the laser diode 3 projects optical beams $B_1'$ on a spot-irradiated region J, of the substrate 31 at a prescribed angle, and a photoelectric converter 7 receives optical beams $B_2'$ reflected by the spot-irradiated region J', and thereafter the light receiving signal EE(x) is outputted from the photoelectric converter 7 and is stored in a buffer memory (not shown) of the arithmetic circuit 40. Then, the central position M, of the reflected optical beams $B_2'$ is obtained on the basis of the light receiving signal EE(x) (at step S22 ), and thereafter the position signal $S_M'$ showing the central position M' obtained at the aforementioned step S22 is outputted from the arithmetic circuit 4o. At the step S23, the position signal $S_M'$ is calibrated on the basis of an initialized value and the like to obtain the position of the measured surface 31a of the substrate 31. Then, a signal $S_x'$ showing the position of the substrate S1 is outputted At the step S24, the space between the substrate and the photomask 35 is calculated on the basis of the signals $S_x$ and $s_x'$ and is outputted from the arithmetic circuit 39.

Thereafter, on the basis of the space measured by the optical position detecting apparatus 36, the chuck 30 loading the substrate S1 is lifted up so that the substrate S1 and the photomask 35 are specifically arranged to be separated by a constant space for an exposure treatment. Then, the exposure treatment is performed.

Since the space can be measured with higher accuracy and the substrate 31 and the photomask 35 can be specifically arranged to have a constant space therebetween, an error in the exposure treatment is prevented.

In the case where color filters, thin film transistors and the like are formed on the substrate, however discontinuous parts appear in the light receiving signal EE(x) due to the influence of interference thereon, as shown in FIG.18A. Therefore, the central position M' is varied to a degree determined by the influence of the interference.

On the other hand, the following method can be used in order to obtain the central position M' without the influence of the interference:

The light receiving signal EE(x) is made to correspond to a threshold value determined so as to minimize the interference influence. Thus, a binary signal HH(X) shown in FIG.18B is obtained. Thereafter, the weighted mean of the binary signal HH(x) is calculated, similarly to equation (13), as the central position M'.

While the aforementioned embodiment has been described with reference to the case where the first embodiment shown in FIG. 4 is integrated into the proximity exposure system, each of the other embodiments also can be integrated into the aforementioned embodiment.

Although the above embodiment has been described with reference to an optical position detecting apparatus for a proximity exposure apparatus, the present invention is not restricted to this but can be applied to a projector/exposure, a pattern measuring apparatus, an automatic focusing apparatus, a general position detector and the like.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A method of optically detecting the position of a surface of an object, said surface having first and second types of surface reflecting regions, each region having a different reflectance coefficient, said method comprising the steps of:

projecting first incident optical beams onto said surface;

receiving a first reflected optical subbeam reflected by said first reflecting region onto an array of photoelectric conversion elements to obtain a first light receiving signal responsive to a light intensity distribution of said first reflected optical subbeam and receiving a second reflected optical subbeam reflected by said second reflecting region onto said array to obtain a second light receiving signal responsive to a light intensity distribution of said second reflected optical subbeam;

multiplying said second light receiving signal by a ratio of reflectance of said first reflecting region to said second reflecting region to produce a correction light receiving signal; and determining a central position of said first reflected optical beams as a function if said first light receiving signal and said correction light receiving signal.

2. An optical position detecting method in accordance with claim 1, wherein said central position of said reflected optical beams step is obtained by calculating a weighted mean of a corrected signal formed by said first light receiving signal and said correction light receiving signal.

3. An optical position detecting method for determining a space between first and second objects having first and second surfaces, respectively, which surfaces face one another, each surface having first and second types of optical reflecting regions having different reflectance coefficients, said method comprising the steps of:

projecting first incident optical beams onto said first surface, receiving at a first array of photoelectric conversion elements a first reflected optical subbeam reflected by said first reflecting region to obtain a first light receiving signal responsive to a light intensity distribution of said first reflected optical subbeam and receiving at said first array of photoelectric conversion element a second reflected optical subbeam reflected by said second reflecting region to obtain a second light receiving signal responsive to a light intensity distribution of said second reflected optical subbeam;

multiplying said second light receiving signal by a reflectance ratio of said first and second reflecting regions of said first surface to produce a correction light receiving signal;

determining a central position of said first reflected optical beams as a function of said first light receiving signal and said correction light receiving signal;

projecting second incident optical beams onto said second surface and receiving at a second array of photoelectric conversion elements second reflected optical beam to obtain a third light receiving signal;

determining a central position of said second reflect red optical beams as a function of said third light receiving signal; and calculating the space between said first object and said second object as a function of said central positions of said first and second reflected optical beams.

4. A method of optically detecting the position of a measured surface of an object having first sand second types of surface reflecting regions, each region having a different reflectance coefficient, said method comprising the steps of:

projecting first incident optical beams onto said measured surface;

receiving at an array of photoelectric conversion elements a first reflected optical subbeam reflected by said first reflecting region to obtain a first light receiving signal responsive to a light intensity distribution of said first reflected optical subbeam and receiving at said array a second reflected optical subbeam reflected by said second reflecting region to obtain a second light receiving signal responsive to a light intensity distribution of said second reflected optical subbeam;

multiplying said second light receiving signal by a reflectance ratio of said first reflecting region to that of said second reflecting region to produce a correction light receiving signal; and determining a central position of said first reflected optical beams as a function of said first light receiving signal, said second light receiving signal and said correction light receiving signal.

5. An optical position detecting method in accordance with claim 4, wherein said obtaining step comprises the steps of:

obtaining a difference between said second light receiving signal and said correction light receiving signal to produce a difference signal; and obtaining a first weighted mean of said difference;

obtaining a second weighted mean of a receiving signal formed by said first light receiving signal and said second light receiving signal; and obtaining said central position as a function of said first and second weighted means.

6. An optical position detecting method for determining a space between first and second objects having first and second measured surfaces, respectively, which surfaces face one another, each measured surface having first and second types of optical reflecting regions having different reflectance coefficients, said method comprising the steps of:

projecting first incident optical beams onto said first measured surface;

receiving at a first array of photoelectric conversion elements a first reflected optical subbeam reflected by said first reflecting region to obtain a first light receiving signal responsive to a light intensity distribution of said fist reflected optical subbeam;

receiving at said first array a second reflected optical subbeam reflected by said second reflecting region to obtain a second light receiving signal responsive to a light intensity distribution of said second reflected optical subbeam;

multiplying said second light receiving signal by a reflectance ratio of said first and second reflecting regions of said first surface to produce a correction light receiving signal;

determining a central position of said first reflected optical beams as a function of said firs tight receiving signal, said second light receiving signal and said correction light receiving signal;

projecting second incident optical beams onto said second measured surface and receiving at a second array of photoelectric conversion elements second reflected optical beams to obtain a third light receiving signal;

obtaining a central position of said second reflected optical beams as a function of said third light receiving signal; and calculating the space between said first object and said second object as a function of said central positions of said first and second reflected optical beams.

7. A method of optically detecting the position of a measured surface of an object, said surfce having first and second types of surface reflecting regions, each region having a different reflectance coefficient, said method comprising the steps of:

projecting first incident optical beams onto said measured surface;

receiving at an array of photoelectric conversion elements a first reflected optical subbeam reflected by said first reflecting region to obtain a first light receiving signal responsive to a light intensity distribution of said first reflected optical subbeam;

receiving at said array a second reflected optical subbeam reflected by said second reflecting region to obtain a second light receiving signal responsive to a light intensity distribution of said second reflected optical subbeam;

defining first and second threshold values by making the ratio of said first threshold value to said second threshold value equal to a ratio between the reflectance of said fist and second reflecting regions and thereafter digitizing said first light receiving signal as a function of said fist threshold value and digitizing said second light receiving signal as a function of said second threshold value to thereby obtain a binary signal; and obtaining a central position of said reflected optical beams as a function of said binary signal.

8. An optical position detecting method in accordance with claim 7, wherein said central position of said reflected optical beams step is the midpoint between a position where said binary signal is switched from a first level to a second level and that where the binary signal is switched from the second level to the first level.

9. An optical position detecting method in accordance with claim 7, wherein
said central position of said reflected optical beams step is obtained by finding a weighted mean of said binary signal.

10. An optical position detecting method for determining a space between first and second objects having fist and second surfaces, respectively, each surface having first and second types of optical reflecting regions having different reflectance coefficients, said method comprising the steps of:
projecting first incident optical beams onto said first surface;
receiving at a first array of photoelectric conversion elements a first reflected optical subbeam reflected by said first reflecting region on said first surface to obtain a first light receiving signal responsive to a light intensity distribution of said first reflected optical subbeam;
receiving at said first array a second reflected optical subbeam reflected by said second reflecting region on said first surface to obtain a second light receiving signal responsive to a light intensity distribution of said second reflected optical subbeam;
defining first and second threshold values having a ratio equal to a ratio between said reflectance of said fist and second reflecting regions of said first surface;
digitizing said first light receiving signal as a function of said first threshold value and digitizing said second light receiving signal as a function of said second threshold value thereby to obtain a binary signal;
determining a central position of said reflected optical beams as a function of said binary signal;
projecting second incident optical beams onto said second measured surface and receiving at a second array of photoelectric conversion elements second reflected optical beams to obtain a third light receiving signal;
determining a central position of said second reflected optical beams as a function of said third light receiving signal; and
calculating the space between said first object and said second object as a function of said central positions of said first and second reflected optical beams.

11. An optical apparatus for detecting the position of an object having a surface, said surface including first and second types of reflecting regions, said regions having different reflectance coefficients from each other, said apparatus comprising:
means for projecting first incident optical beams onto said surface,
an array of photoelectric conversion elements positioned to receive a first reflected optical subbeam reflected by said first reflecting region to produce a first light receiving signal responsive to a light intensity distribution of said first reflected optical subbeam and to receive a second reflected optical subbeam reflected by said second reflecting region to produce a second light receiving signal responsive to a light intensity distribution of said second reflected optical subbeam;
means for multiplying said second light receiving signal by a ratio between the reflectance of said first reflecting region to the reflectance of said second reflecting region to produce a correction light receiving signal; and
means for determining a central position of said first reflected optical beams as a function of said first light receiving signal and said correction light receiving signal.

12. An optical apparatus for detecting the position of an object having a surface including first and second types of reflecting regions, each region having different reflectance coefficients form each other, said apparatus comprising:
means for projecting first incident optical beams onto said surface;
an array of photoelectric conversion elements position to receive a first reflected optical subbeam reflected by said firs reflecting region to produce a first light receiving signal responsive to a light intensity distribution of said first reflected optical subbeam and to receive a second reflected optical subbeam reflected by said second reflecting region to produce a second light receiving signal responsive to a light intensity distribution of said second reflected optical subbeam;
means for multiplying said second light receiving signal by a ratio between the reflectance of said first reflecting region to the reflectance of said second reflecting region to produce a correction light receiving signal; and
means for determining a central position of said first reflected optical subbeam as a function of said first light receiving signal, said second light receiving signal and said correction light receiving signal.

13. An optical apparatus for detecting the position of san object having a surface, said surfce including first and second types of reflecting regions having different reflectance coefficients from each other, said apparatus comprising:
means for projecting first incident optical beams onto said surface;
an array of photoelectric conversion elements positioned to receive a first reflected optical subbeam reflected by said first reflecting region to produce a first light receiving signal responsive to a light intensity distribution of aid first reflected optical subbeam and to receive a second reflected optical subbeam reflected by said second reflecting region to produce a second light receiving signals responsive to a light intensity distribution of said second reflected optical subbeam;
means for generating first and second threshold values to correspond to a reflectance ratio between said first and second light reflecting regions and digitizing said first light receiving signal as a function of said first threshold value and digitizing said second light receiving signal as a function of said second threshold value to obtain a binary signal; and
means for deriving a central position of said reflected optical beams as a function of said binary signal.

14. An optical position detecting apparatus in accordance with claims 11, 12 or 13, further comprising:
second means for projecting second incident optical beams onto a second surface, facing said first surface, of a second object, wherein said second surface includes first and second types of optical reflecting regions having different reflection coefficients;

a second array of photoelectric conversion elements positioned to receive second reflected optical beams reflected by said second measured surface to produce a third light receiving signal at an output of said second photoelectric conversion element;

second means for deriving a central position of said second reflected optical beams as a function of said third light receiving signal; and an arithmetic circuit for calculating a space between said first surface and said second surface as a function of said central positions.

* * * * *